(12) United States Patent
Akimoto

(10) Patent No.: US 11,011,104 B2
(45) Date of Patent: May 18, 2021

(54) IMAGE DISPLAY DEVICE AND METHOD FOR MANUFACTURING IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/726,936

(22) Filed: Dec. 26, 2019

(65) Prior Publication Data

US 2020/0211451 A1 Jul. 2, 2020

(30) Foreign Application Priority Data

Dec. 28, 2018 (JP) .............................. JP2018-247295

(51) Int. Cl.
| | |
|---|---|
| *H01L 27/32* | (2006.01) |
| *G09G 3/32* | (2016.01) |
| *G09G 3/20* | (2006.01) |
| *H01L 33/50* | (2010.01) |
| *H01L 33/44* | (2010.01) |

(52) U.S. Cl.
CPC ............. *G09G 3/32* (2013.01); *G09G 3/2003* (2013.01); *G09G 3/2074* (2013.01); *H01L 27/3248* (2013.01); *H01L 33/44* (2013.01); *H01L 33/504* (2013.01); *H01L 2933/0041* (2013.01)

(58) Field of Classification Search
CPC ...... G09G 3/32; G09G 3/2003; G09G 3/2074; H01L 33/44; H01L 33/504; H01L 2933/0041; H01L 27/3248; H01L 27/322
See application file for complete search history.

(56) References Cited

U.S. PATENT DOCUMENTS

2014/0367633 A1* 12/2014 Bibl ....................... H01L 27/322
  257/13
2017/0193898 A1* 7/2017 Lee ..................... H01L 27/3248

FOREIGN PATENT DOCUMENTS

| JP | 2016-523450 | 8/2016 |
|---|---|---|
| JP | 2017-54092 | 3/2017 |

* cited by examiner

*Primary Examiner* — Abdul-Samad A Adediran
(74) *Attorney, Agent, or Firm* — Mori & Ward, LLP

(57) ABSTRACT

An image display device includes pixels each of which includes subpixels including a first subpixel and a second subpixel. The first subpixel includes a first light-emitting element configured to emit isochromatic light and a first wavelength conversion layer provided over the first light-emitting element to emit red light. The second subpixel includes a second light-emitting element configured to emit the isochromatic light and a second wavelength conversion layer provided over the second light-emitting element to emit green light. The pixels includes at least one pixel which includes a defective subpixel. A drive circuit is configured to drive the subpixels based on data of an image signal such that the pixels reproduces the data of the image signal. The drive circuit is configured to drive the first subpixel and the second subpixel based on the position data and data of red and green luminances.

18 Claims, 8 Drawing Sheets

IMAGE DISPLAY DEVICE AND METHOD FOR MANUFACTURING IMAGE DISPLAY DEVICE

CROSS-REFERENCE TO RELATED APPLICATIONS

This application is based upon and claims priority to Japanese Patent Application No. 2018-247295, filed on Dec. 28, 2018; the entire contents of which are incorporated herein by reference.

FIELD

Embodiments described herein relate generally to an image device and a method for manufacturing the image display device.

BACKGROUND

It is desirable to realize an image display device that is thin and has high luminance, a wide viewing angle, high contrast, and low power consumption. To satisfy such market needs, a display device that utilizes a self-luminous element is being developed as shown in JP 2016-523450 A.

There are expectations for the advent of a display device using a micro LED which is a fine light-emitting element as a self-luminous element. When micro LEDs are used in an image display device, the number of elements increases as the image quality increases as in full high definition, 4K, 8K, etc., which makes yield improvement problematic.

In a micro LED image display device, the micro LEDs that are determined to be good parts in an electrical inspection are mounted to a panel module. A quality determination is performed again in a display confirmation inspection or the like for the panel module to which the micro LEDs are mounted.

Thus, because inspections are performed multiple times, the overall yield of the image display device is the yield at the inspection of the individual micro LEDs multiplied by the yield when mounting and after mounting to the panel module. Therefore, because the number of the mounted elements increases as the image quality increases, it is difficult to sufficiently increase the overall yield; and it may be difficult to have cost competitiveness with image display devices of other techniques.

Accordingly, for an image display device that uses micro LEDs, it is necessary to suppress the yield decrease and reduce the manufacturing cost.

SUMMARY OF INVENTION

According to one aspect of the present invention, an image display device includes a plurality of pixels and a drive circuit. Each of the plurality of pixels includes a plurality of subpixels. The plurality of subpixels includes a first subpixel and a second subpixel. The first subpixel includes a first light-emitting element configured to emit isochromatic light and a first wavelength conversion layer provided over the first light-emitting element to emit red light. The second subpixel includes a second light-emitting element configured to emit the isochromatic light and a second wavelength conversion layer provided over the second light-emitting element to emit green light. The plurality of pixels includes at least one pixel which includes a defective subpixel, the first subpixel, and the second subpixel. The drive circuit is configured to drive the plurality of subpixels based on data of an image signal such that the plurality of pixels reproduces the data of the image signal. The drive circuit includes position data designating positions of the defective subpixel, the first subpixel, and the second subpixel. The drive circuit is configured to drive the first subpixel and the second subpixel based on the position data and data of red and green luminances.

According to another aspect of the present invention, a method for manufacturing an image display device which includes a plurality of pixels including a plurality of subpixels includes a defective subpixel detection process and a wavelength conversion layer formation process. The defective subpixel detection process includes preparing the plurality of subpixels which include a plurality of light-emitting elements to emit light, respectively; turning on the plurality of light-emitting elements; acquiring image data of the plurality of light-emitting elements which have been turned on; acquiring position data of positions of defective light-emitting elements and other light-emitting elements among the plurality of light-emitting elements; and storing the position data. The wavelength conversion layer formation process includes providing, based on the position data, a first wavelength conversion layer over one of the plurality of light-emitting elements to emit red light, and providing, based on the position data, a second wavelength conversion layer over another of the plurality of light-emitting elements to emit green light.

According to further aspect of the present invention, an image display device includes a plurality of pixels and a drive circuit. Each of the plurality of pixels includes a plurality of subpixels. The plurality of subpixels includes a first light-emitting element configured to emit isochromatic light; a first wavelength conversion layer provided over the first light-emitting element to emit red light; a second light-emitting element configured to emit the isochromatic light; a second wavelength conversion layer provided over the second light-emitting element to emit green light; a third light-emitting element configured to emit the isochromatic light; and a third wavelength conversion layer provided over the third light-emitting element to emit blue light. The plurality of pixels includes at least one pixel which includes a defective subpixel; one subpixel including the first wavelength conversion layer; and another subpixel including the second wavelength conversion layer. The drive circuit is configured to drive the plurality of subpixels based on data of an image signal such that the plurality of pixels reproduces the data of the image signal. The drive circuit includes position data designating positions of the defective subpixel, the one subpixel, and the another subpixel. The drive circuit is configured to drive the one subpixel and the another subpixel based on the position data and data of red and green luminances.

DETAILED DESCRIPTION

Figure 1:
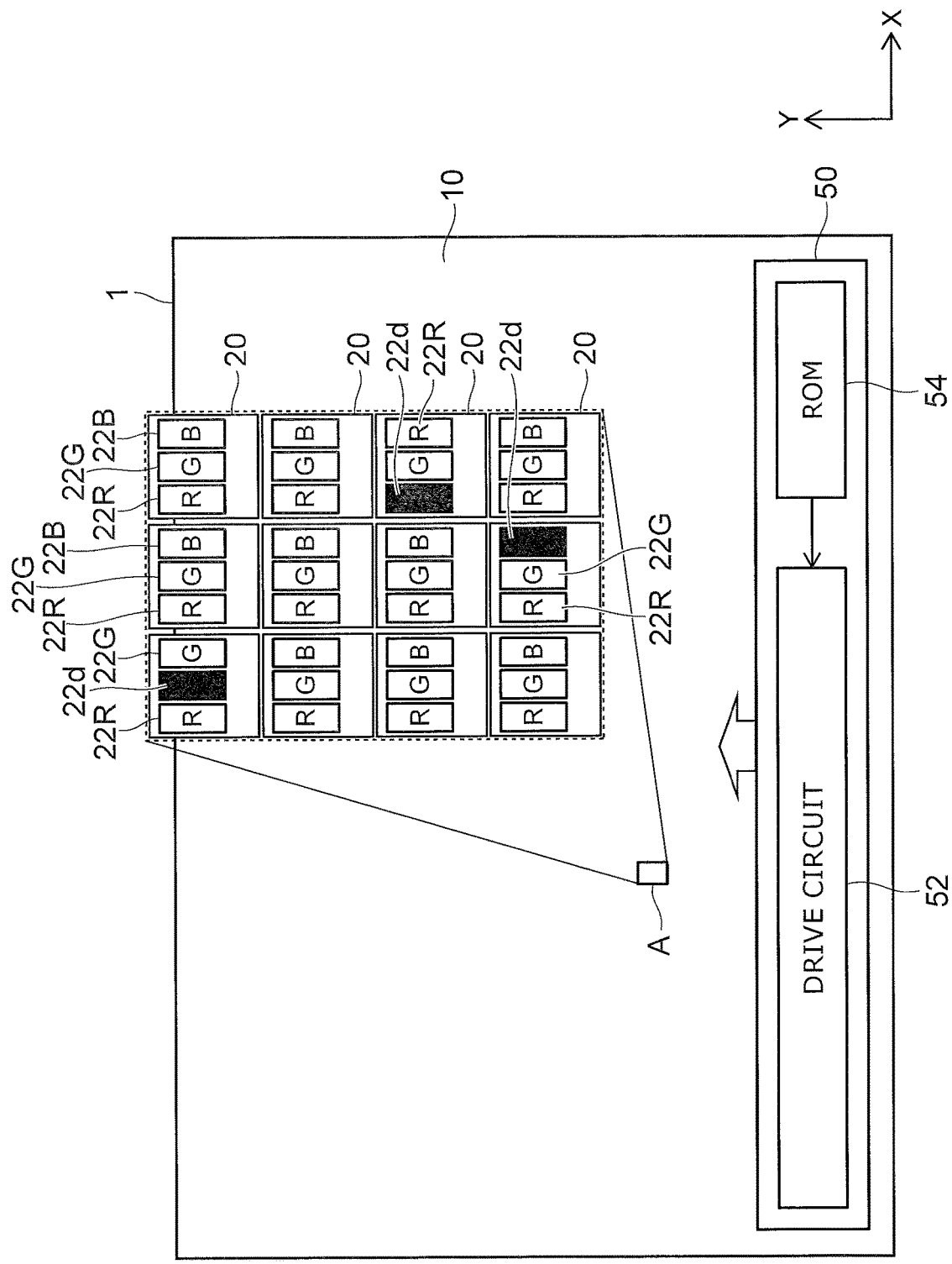
FIG. 1 is a schematic block diagram illustrating an image display device according to a first embodiment.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with the same reference numerals; and a detailed description is omitted as appropriate.

In the specification, the light emission color being isochromatic or being the same includes wavelength differences within an appropriate range. For example, blue light refers to light of a wavelength of about 450 nm to 495 nm; green light refers to light of a wavelength of about 495 nm to 570 nm; and red light refers to light of a wavelength of about 620 to 750 nm. In the ranges as described above, also, isochromatic may be taken as an error range or a threshold provided in an appropriate range.

First Embodiment

FIG. 1 is a schematic block diagram illustrating an image display device according to an embodiment.

As shown in FIG. 1, the image display device 1 of the embodiment includes a display region 10 and a drive IC 50. The display region 10 and the drive IC 50 are provided on a not-illustrated substrate. In the substrate, an interconnect pattern is provided in one surface of an insulative base material and electrically connected to the light-emitting elements included in subpixels 22R, 22G, and 22B of each pixel 20.

As illustrated, the image display device 1 is substantially rectangular when viewed in plan; hereinbelow, the direction in which the long sides extend is taken as an X-axis; and the direction in which the short sides extend is taken as a Y-axis.

The display region 10 occupies almost the entire portion of the image display device 1. The pixels 20 are formed in the display region 10. For example, the pixels 20 are arranged in a lattice configuration in the X-axis direction and the Y-axis direction. The number of the pixels 20 arranged in the X-axis direction and the Y-axis direction is the resolution of the image display device 1. For example, in an image display device having full high definition image quality, 1920×1080≈2 million pixels 20 are arranged in the display region 10. In an image display device having 4K image quality, 3840×2160≈8 million pixels 20 are arranged. In an image display device having 8K image quality, 7680×4320≈33 million pixels 20 are arranged.

The pixels 20 that are formed in the display region 10 each are driven by a drive circuit 52 of the drive IC 50. The drive circuit 52 drives each pixel based on not-illustrated external image data and display control data.

For example, as in the example, the drive IC 50 is provided along the lower side portion of the display region 10. The drive IC 50 includes ROM 54. As elaborated below, the ROM 54 stores positions of defective subpixels; and the drive circuit 52 determines the light emission colors of the normal subpixels and switches ON the normal subpixels based on the positions of the defective subpixels.

FIG. 1 shows an enlarged view of portion A which is a portion of the matrix of the pixels 20 arranged in the display region 10. 3×4 pixels 20 are shown in portion A.

The pixel 20 includes the three subpixels 22R, 22G, and 22B. The subpixel 22R emits light of a red light emission color. The subpixel 22G emits light of a green light emission color. The subpixel 22B emits light of a blue light emission color. The light emission color and the luminance of the pixel are determined by the drive circuit 52 adjusting the luminances of the subpixels 22R, 22G, and 22B.

In the case of the embodiment, an electrical inspection of the light-emitting elements included in the subpixels is not performed before forming the display region 10. Therefore, as shown in portion A, the display region 10 may include defective subpixels 22d. The defective subpixels 22d may be caused by defects of the light-emitting elements or discrepancies when mounting the light-emitting elements. As described below, the defective subpixels 22d may be a lighting failure in which the luminance is lower than a desired luminance, a case where the luminance is higher than a desired luminance, or a case of being in the lit state continuously regardless of the drive signal of the drive circuit 52.

As described below with reference to FIG. 2A, FIG. 2B, and FIG. 2C, each normal subpixel includes a light-emitting element and a wavelength conversion layer of a fluorescer material or the like. In the defective subpixel 22d, a wavelength conversion layer of the fluorescer material or the like is not formed at the light-emitting element. Or, in the defective subpixel 22d, a wavelength conversion layer of an opaque material is formed at the light-emitting element.

If a defect does not exist in a subpixel inside the pixel 20, for example, the three subpixels 22R, 22G, and 22B are arranged in this order toward the positive direction of the X-axis. If one defect exists in a subpixel inside the pixel 20, the subpixel that has the light emission color of the location where the defect exists is then disposed at the position in the pixel of the subpixel 22B having the blue light emission color.

For example, in the pixel 20 of the uppermost row and the leftmost column in portion A, the subpixel of the central column is the defective subpixel 22d. Originally, the subpixel 22G that has the green light emission color would be disposed in the central column. Because the subpixel of the central column is the defective subpixel 22d, the subpixel 22G that has the green light emission color is disposed at the position in the pixel of the subpixel having the blue light emission color.

In the pixel 20 of the rightmost column and the third row from the top in portion A, the subpixel in the left column is the defective subpixel 22d. Originally, the subpixel 22R that has the red light emission color would be disposed in the subpixel of the left column. Because the subpixel of the left column is the defective subpixel 22d, the subpixel 22R that has the red light emission color is disposed at the position in the pixel of the subpixel having the blue light emission color.

In the pixel 20 of the lowermost row and the central column in portion A, the subpixel in the right column is the defective subpixel 22d. Originally, the subpixel 22B that has the blue light emission color would be disposed in the subpixel of the right column; but the subpixel in the right column is the defective subpixel 22d. In such a case, the subpixel 22R that has the red light emission color and the subpixel 22G that has the green light emission color are disposed at the original positions. The subpixel 22B that has the blue light emission color remains as the defective subpixel 22d.

That is, all of the defective subpixels 22d are the subpixel 22B having the same blue light emission color. In the vision of a human, among the three primary colors of light, the sensitivity to blue is lower than the sensitivity to the other colors. Therefore, in the manufacturing processes of the image display device 1 of the embodiment, when the defective subpixel 22d is detected in the process of forming the wavelength conversion layer of the fluorescer layer, etc., the subpixel 22B that is disposed at the position in the pixel of the subpixel having the blue light emission color is replaced with the subpixel 22R or 22G having the red or green light emission color.

The ROM 54 of the drive IC 50 stores the positions of the defective subpixels 22d and sets the drive circuit 52 to drive the normal subpixels using data of the light emission colors corresponding to the positions.

Figure 2A:
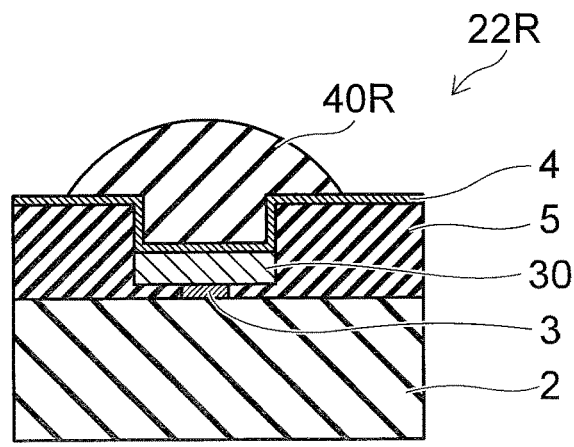
FIG. 2A to FIG. 2C are schematic cross-sectional views illustrating portions of the image display device of the first embodiment.
Figure 2B:
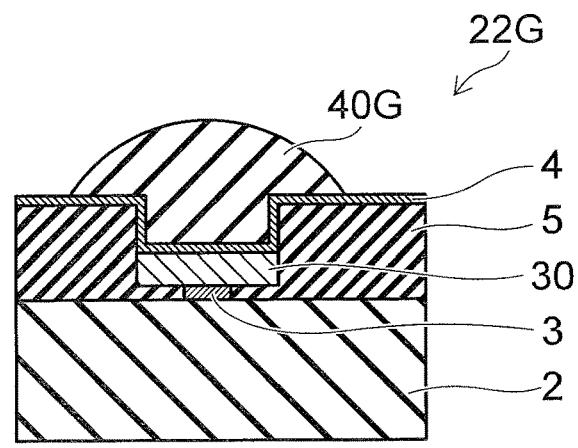
Figure 2C:
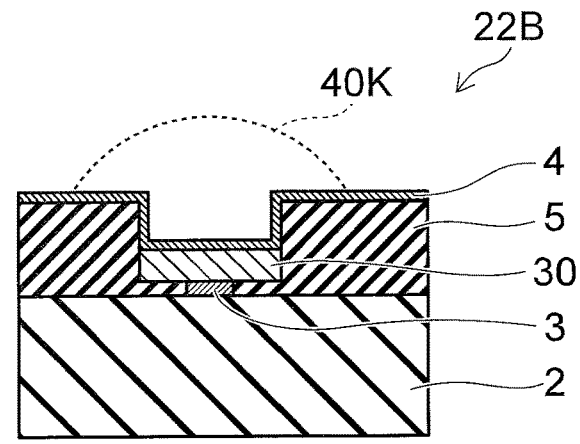

FIG. 2A to FIG. 2C are schematic cross-sectional views illustrating portions of the image display device of the embodiment.

FIG. 2A is a cross-sectional view of the subpixel (a first subpixel) 22R having the red light emission color. A light-emitting element 30 is connected to a first interconnect 3 provided on one surface of an insulative substrate 2. The light-emitting element 30 is connected also to a second interconnect 4 provided on the upper surface of the light-emitting element 30. The light-emitting element 30 is connected to the drive circuit 52, etc., via the first interconnect 3 and the second interconnect 4. An insulating layer 5 is provided between the first interconnect 3 and the second interconnect 4 and electrically insulates between the first interconnect 3 and the second interconnect 4. A fluorescer layer 40R is provided on the upper surface of the light-emitting element 30.

The light-emitting element 30 is, for example, an element emitting blue light including GaN. The fluorescer layer 40R is a wavelength conversion layer of a wavelength conversion material that is excited by wavelengths of blue light and converts the wavelengths into a wavelength of red light.

FIG. 2B is a cross-sectional view of the subpixel (a second subpixel) 22G having the green light emission color. Other than a fluorescer layer 40G, the configuration is similar to that of FIG. 2A. The fluorescer layer 40G is a wavelength conversion layer of a wavelength conversion material that is excited by wavelengths of blue light and converts the wavelengths into a wavelength of green light.

FIG. 2C is the subpixel 22B having the blue light emission color. Because the light-emitting element 30 is a blue light-emitting element, a wavelength conversion layer may not be provided as in the example. A blue wavelength conversion layer may be further provided to adjust the chromaticity of blue and to make the blue light emission color uniform inside the display region 10. By providing the blue wavelength conversion layer, the chromaticity change in oblique directions also can be suppressed.

Even when the subpixel 22B is the defective subpixel 22d, as in the example, a wavelength conversion layer may not be provided; or a blue wavelength conversion layer may be provided. Also, in the defective subpixel 22d, there are cases where the light-emitting element 30 emits light of high luminance or is continuously in the lit state. Therefore, as illustrated by the broken line of the drawing, a wavelength conversion layer 40K that is opaque to the light emission of the light-emitting element 30 may be provided on the light-emitting element 30. The wavelength conversion layer 40K absorbs substantially all wavelengths of the light of the light-emitting element 30. The light emission color of the wavelength conversion layer 40K is substantially black.

Although the light-emitting elements 30 described above all are light-emitting elements emitting the same blue light, instead of a blue light-emitting element, a light-emitting element of ultraviolet light or bluish-violet light of about 405 nm which is advantageous for the luminous efficiency may be used. In such a case, fluorescer layers that convert ultraviolet light into blue light are provided at the normal subpixels 22B. When a subpixel is the defective subpixel 22d, a wavelength conversion layer may not be provided; a blue wavelength conversion layer may be provided; or an opaque wavelength conversion layer may be provided.

Other than general fluorescer materials, the wavelength conversion layers of the light emission colors may use quantum dot fluorescer materials. Quantum dot fluorescer materials are favorable because each light emission color can be realized; the monochromaticity can be high; and the color reproducibility can be high.

Operations of the image display device of the embodiment will now be described.

Figure 3:
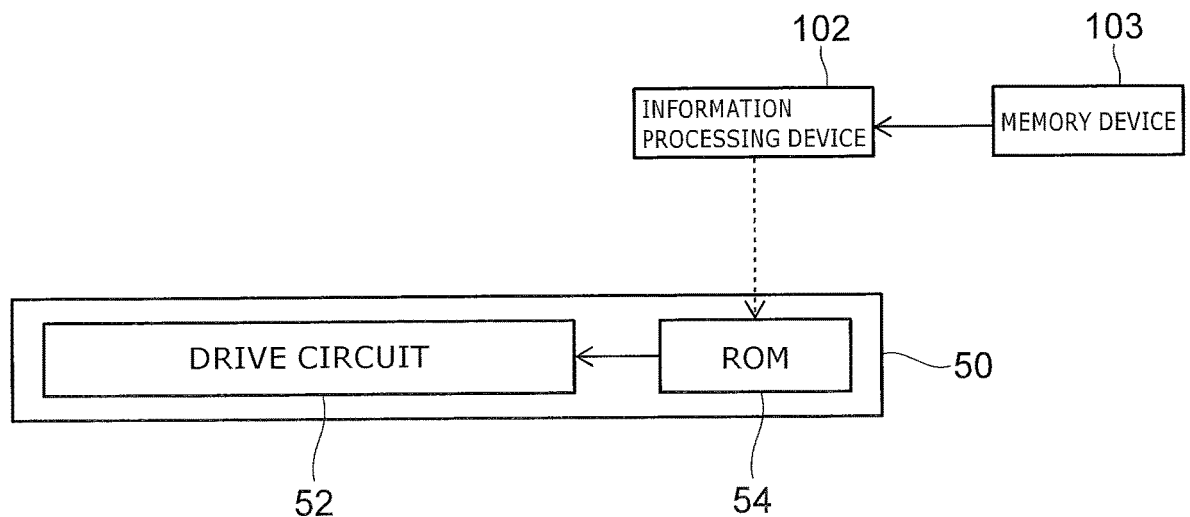
FIG. 3 is a block diagram illustrating a portion of the image display device of the first embodiment.

FIG. 3 is a block diagram illustrating a portion of the image display device of the embodiment.

As described above, the data of the positions of the defective subpixels 22d is stored in the ROM 54 of the drive IC 50. The data of the position of each subpixel 22R, 22G, and 22B of each pixel 20 is preset. For example, the position of each subpixel 22R, 22G, and 22B of each pixel 20 is identified according to XY coordinate data virtually provided inside the display region 10. The original light emission colors of the subpixels are pre-associated in the XY coordinate data.

As shown in FIG. 3, as elaborated below, the data that is stored in the ROM 54 is the data of the positions of the defective subpixels 22d that is acquired in one process of the method for manufacturing the image display device 1, stored in a memory device 103, transferred from the memory device 103 by an information processing device 102, and stored in the ROM 54.

The ROM 54 is read-only memory (ROM) that permits one or multiple data writes. This may be OTPROM (One Time Programmable ROM). The data is written every image display device 1 according to the occurrence state of the defective subpixels 22d of the image display device 1.

The drive circuit 52 operates based on image data and control data supplied from the outside. The drive circuit 52 refers to the data written to the ROM 54, converts the received image data into appropriate drive data, and drives the appropriate subpixels.

A method for manufacturing the image display device 1 of the embodiment will now be described.

Figure 4:
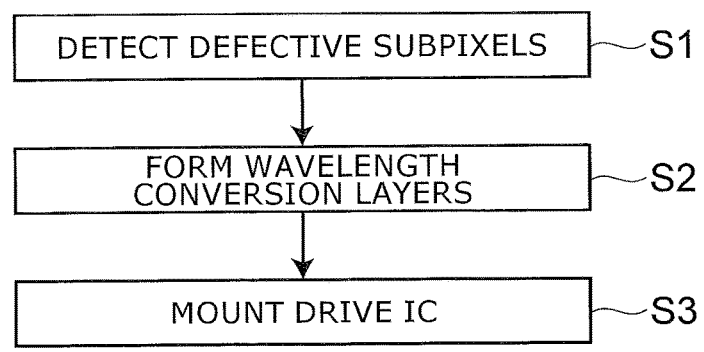
FIG. 4 is a flowchart illustrating the method for manufacturing the image display device according to the first embodiment.

FIG. 4 is a flowchart illustrating the method for manufacturing the image display device according to the embodiment.

In the method for manufacturing the image display device 1 as shown in FIG. 4, the defective subpixels 22d are detected in a defective subpixel detection process S1. As elaborated below, at this time, the light-emitting elements 30 are mounted to the display region 10; but fluorescer layers are not provided at any of the light-emitting elements 30.

That is, all of the defective subpixels 22*d* are determined using the light emission luminances of the light-emitting elements 30 emitting blue or ultraviolet light.

In a wavelength conversion layer formation process S2, the fluorescer layers 40R and 40G are formed respectively at the light-emitting elements 30 corresponding to the normal subpixels 22R and 22G. As described above, blue fluorescer layers may be formed at the light-emitting elements 30 corresponding to the subpixels 22B. The wavelength conversion layer 40K which is a black, i.e., opaque, fluorescer layer may be provided at the light-emitting elements 30 corresponding to the defective subpixels 22*d*.

In a drive IC mounting process S3, the data of the positions of the defective subpixels 22*d* stored in the memory device 103 is written to the ROM 54 of the drive IC 50 via the information processing device 102. The drive IC 50 that includes the ROM 54 to which the data is written is mounted to a prescribed position at the vicinity of the display region 10.

Data that includes a prescribed inspection display pattern, etc., is input to the image display device 1 to which the drive IC 50 is mounted; and the quality of the light emission of each pixel 20 is determined.

The details of each process will now be described.

Figure 5:
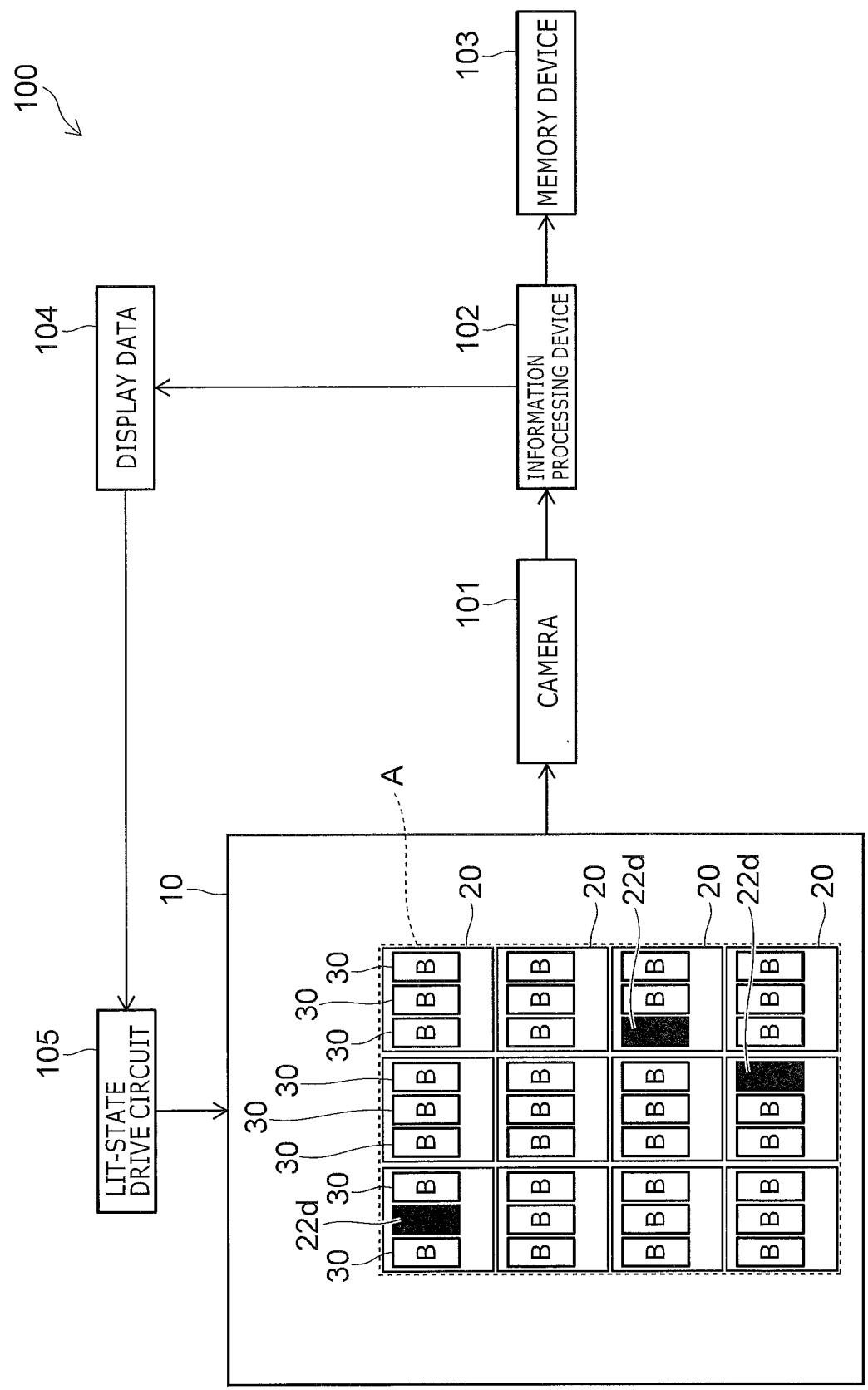
FIG. 5 is an example of a schematic block diagram for describing a portion of the method for manufacturing the image display device of the first embodiment.

FIG. 5 is an example of a schematic block diagram for describing a portion of the method for manufacturing the image display device of the embodiment.

FIG. 5 schematically shows the details of the configuration of a defective subpixel detection system 100 performing the defective subpixel detection process S1.

As shown in FIG. 5, the light-emitting elements 30 that emit blue light are arranged in a lattice configuration in the display region 10. The drawing shows an enlarged view of portion A which is a portion of the display region 10. Similarly hereinafter, the details of the manufacturing processes are described using enlarged views of portion A of the display region 10.

The defective subpixel detection system 100 includes a camera 101, the information processing device 102, and the memory device 103. In the example, the camera 101 is connected to the information processing device 102. The information processing device 102 is connected to the memory device 103. The connections of the devices are not limited to those described above; and any appropriate connection configuration can be used. For example, the camera 101, the information processing device 102, and the memory device 103 may be connected on a common communication network and may be able to mutually transmit and receive data, etc.

Details of the defective subpixel detection process of the defective subpixel detection system 100 will now be described.

The information processing device 102 is, for example, a computer and operates according to a program. The information processing device 102 includes data of a preset imaging region. The data of the imaging region is, for example, the display region 10 split into four regions, etc. The imaging region is set based on the resolution of the camera 101. For example, the imaging region is set so that the resolution of the camera 101 is sufficient to perform the luminance determination when each light-emitting element 30 inside the imaging region is in the lit state.

Data such as the coordinates of the four split regions, etc., and the imaging sequence of the four split regions are set in the program of the information processing device 102. The information processing device 102 supplies, to a lit-state drive circuit 105, display data 104 of the imaging regions that will be imaged.

Based on the display data 104 that is set, the lit-state drive circuit 105 selects, drives, and causes the light-emitting elements 30 to emit light. The lit-state drive circuit 105 may use the drive circuit 52 of the drive IC 50; or a drive circuit different from that of the drive IC 50 may be prepared separately.

The camera 101 images a region including at least the imaging regions of the display region 10 set by the information processing device 102. In the case where the light-emitting element 30 emits ultraviolet light, the camera 101 includes imaging elements sensitive to ultraviolet light.

The information processing device 102 acquires the image data imaged by the camera 101. The information processing device 102 performs image processing of the image data acquired by the program and compares the light emission luminance of each light-emitting element 30 in the imaging regions to a prescribed value.

When the luminance of the light-emitting element is lower than a first prescribed value, the information processing device 102 determines that the light-emitting element 30 is the defective subpixel 22*d*. The information processing device 102 may use multiple prescribed values relating to the determination of the luminance. For example, a second prescribed value has a value greater than the first prescribed value. When the luminance of the light-emitting element 30 is higher than the second prescribed value, the light-emitting element 30 is determined to be the defective subpixel 22*d*.

Even if the luminance is within the range from the first prescribed value to the second prescribed value, the light-emitting element 30 is determined to be the defective subpixel 22*d* if the light-emitting element 30 is in the lit state even when all of the drive signals of the lit-state drive circuit 105 are OFF.

The information processing device 102 determines the positions of the detected defective subpixels 22*d*.

The information processing device 102 sets the data of the positions relating to all of the defective subpixels 22*d* inside the image data of the imaging region and transfers the data to the memory device 103.

The information processing device 102 sets the display data 104 of the next imaging region according to the program.

The information processing device 102 repeatedly performs the operations recited above for all of the imaging regions.

Details of the wavelength conversion layer formation process will now be described.

Figure 6:
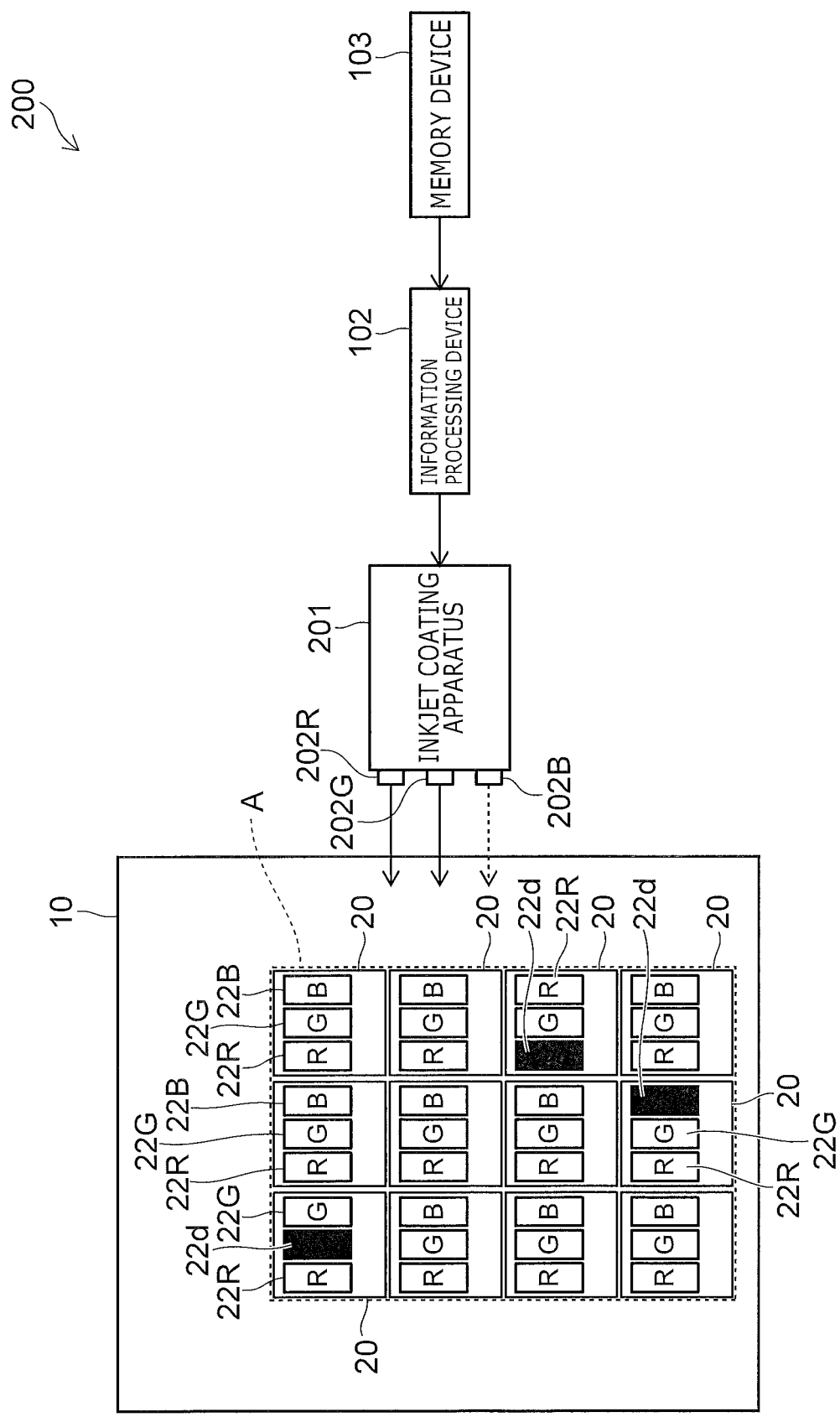
FIG. 6 is an example of a schematic block diagram for describing a portion of the method for manufacturing the image display device of the first embodiment.

FIG. 6 is an example of a schematic block diagram for describing a portion of the method for manufacturing the image display device of the embodiment.

FIG. 6 schematically shows the details of the configuration of a wavelength conversion layer formation system 200 performing the wavelength conversion layer formation process S2.

As shown in FIG. 6, the wavelength conversion layer formation system 200 includes an inkjet coating apparatus 201, the information processing device 102, and the memory device 103. The information processing device 102 and the memory device 103 can be the same as those used in the defective subpixel detection system 100 described above.

The inkjet coating apparatus 201 includes nozzles 202R and 202G. The nozzle 202R dispenses a fluorescent coating for forming a red fluorescer layer. The nozzle 202G dispenses a fluorescent coating for forming a green fluorescer layer. The color purity can be improved by mixing a red pigment or dye into the red fluorescent coating. The color purity can be improved by mixing a green pigment or dye into the green fluorescent coating.

As shown by a broken line, the inkjet coating apparatus 201 may include a nozzle 202B dispensing a fluorescent coating for forming a blue fluorescer layer. A nozzle that dispenses an opaque coating having black coloring may be provided instead of the nozzle 202B or in addition to the nozzle 202B.

The information processing device 102 accesses the memory device 103. The information processing device 102 acquires the data of the positions of the defective subpixels 22d stored by the defective subpixel detection system 100 and stored in the memory device 103.

The information processing device 102 transmits, to the inkjet coating apparatus 201, the data of the positions of the defective subpixels 22d acquired from the memory device 103.

The position data that corresponds to the light emission colors of the subpixels arranged in the display region 10 is provided beforehand to the inkjet coating apparatus 201. The inkjet coating apparatus 201 replaces the initial position data with the data relating to the defective subpixels 22d received from the information processing device 102.

For example, the data that is transmitted from the information processing device 102 shows that the center subpixel in the pixel 20 of the uppermost row and the leftmost column in portion A is the defective subpixel 22d. In the initial position data of the inkjet coating apparatus 201, the light emission color of the center subpixel is green. The inkjet coating apparatus 201 replaces the coating color of the light-emitting element 30 in the right column with green. If there are no defective subpixels, the light-emitting element 30 in the right column is the position of the original subpixel emitting blue light.

In the case of the pixel 20 of the rightmost column and the third row from the top in portion A, the data that is transmitted from the information processing device 102 shows that the subpixel in the left column is the defective subpixel 22d. In the initial position data of the inkjet coating apparatus 201, the light emission color of the subpixel in the left column is red. The inkjet coating apparatus 201 replaces the coating color of the light-emitting element 30 in the right column with red. If there are no defective subpixels, the light-emitting element 30 in the right column is the position of the original subpixel emitting blue light.

In the case of the pixel 20 of the lowermost row and the central column in portion A, the data that is transmitted from the information processing device 102 shows that the subpixel in the right column is the defective subpixel 22d. In the initial position data of the inkjet coating apparatus 201, the light emission color of the subpixel in the right column is blue. The inkjet coating apparatus 201 uses the initial position data as-is without replacing.

Figure 7:
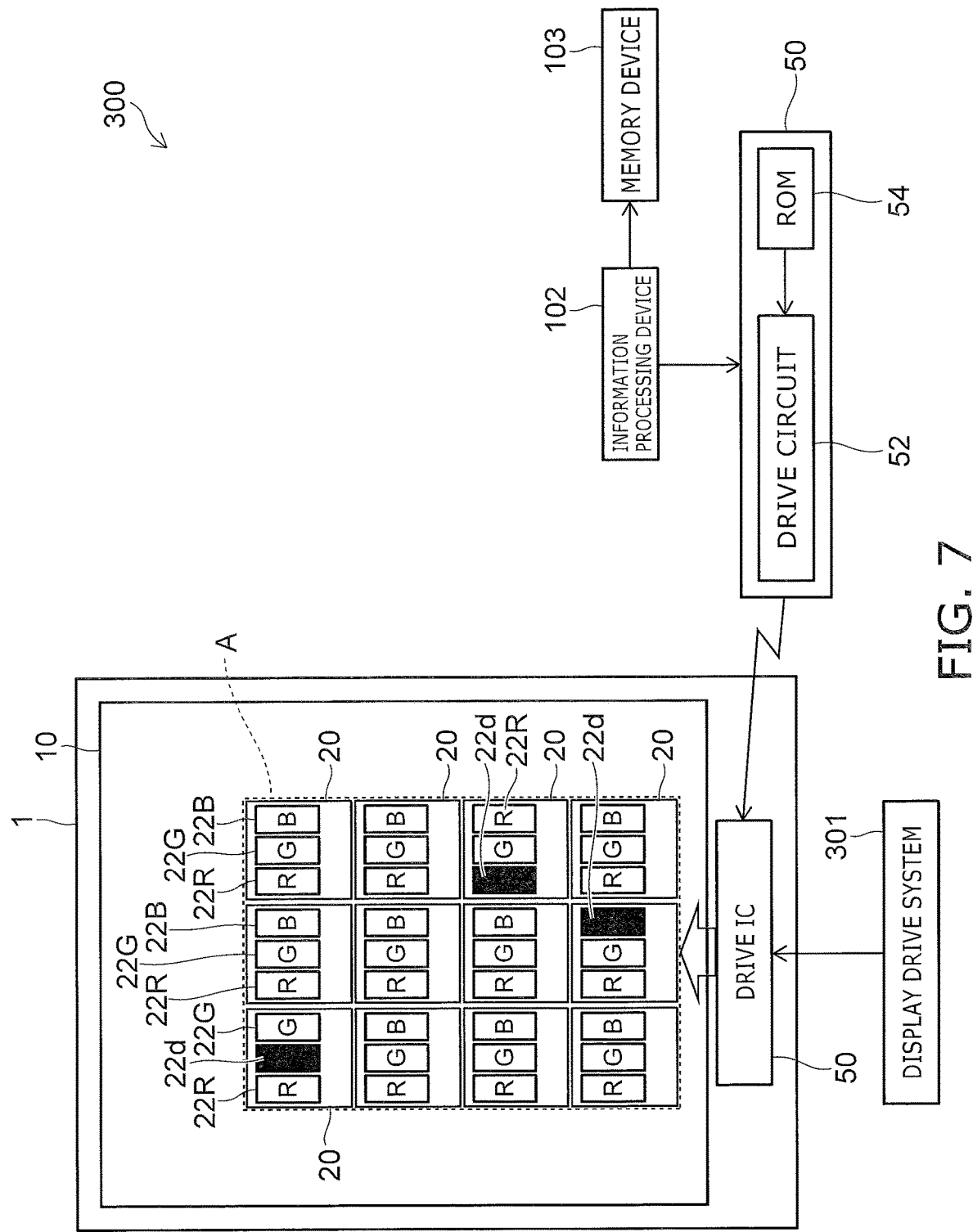
FIG. 7 is an example of a schematic block diagram for describing a portion of the method for manufacturing the image display device of the first embodiment.

FIG. 7 is an example of a schematic block diagram for describing a portion of the method for manufacturing the image display device of the embodiment.

FIG. 7 schematically shows the details of the configuration of a drive IC mounting system 300 performing the drive IC mounting process S3.

As shown in FIG. 7, the drive IC mounting system 300 includes the information processing device 102 and the memory device 103. The information processing device 102 and the memory device 103 can be the same as those used in the defective subpixel detection system 100 and the wavelength conversion layer formation system 200.

The information processing device 102 accesses the memory device 103 and acquires the data of the positions of the defective subpixels 22d.

The information processing device 102 writes, to the ROM 54, the acquired data of the positions of the defective subpixels 22d.

The drive IC 50 is mounted to a prescribed position of the image display device 1 by a not-illustrated electronic component mounting system. The writing of the data to the ROM 54 may be performed after mounting the drive IC.

The image display device 1 is connected to a display drive system 301. Data such as an inspection display pattern, etc., is supplied from the display drive system 301 to the image display device 1; and the quality of each pixel 20 is determined.

Thus, the image display device 1 of the embodiment can be manufactured.

Effects of the image display device 1 of the embodiment will now be described.

The image display device 1 of the embodiment designates the positions of the defective subpixels 22d after mounting the light-emitting elements 30 to the display region 10 and switching ON the light-emitting elements 30. Therefore, an inspection process of the light-emitting elements 30 as single bodies before mounting is unnecessary.

The defective subpixel 22d is set to be blue for which the visual sensitivity of a human is low; and the remaining normal subpixels are set to the light emission colors of red and green regardless of the position of the defective subpixel. Therefore, even when the defective subpixel 22d is found in a process detecting the defective subpixels 22d, the effect on the display data of the entire image display device 1 can be low; therefore, the image display device 1 can be manufactured without reducing the yield of the final product.

Instead of using a blue inorganic semiconductor light-emitting element, the light-emitting element 30 can be a light-emitting element emitting ultraviolet light by forming a fluorescer layer emitting blue light at the blue subpixels. By using a light-emitting element emitting ultraviolet light, the luminous efficiency of the fluorescer can be high, which contributes to a higher luminance of the image display device and lower power consumption.

Second Embodiment

The image display device described above can be used as an image display module having the appropriate number of pixels in, for example, a computer display, a television, a portable terminal such as a smartphone, car navigation, etc.

Figure 8:
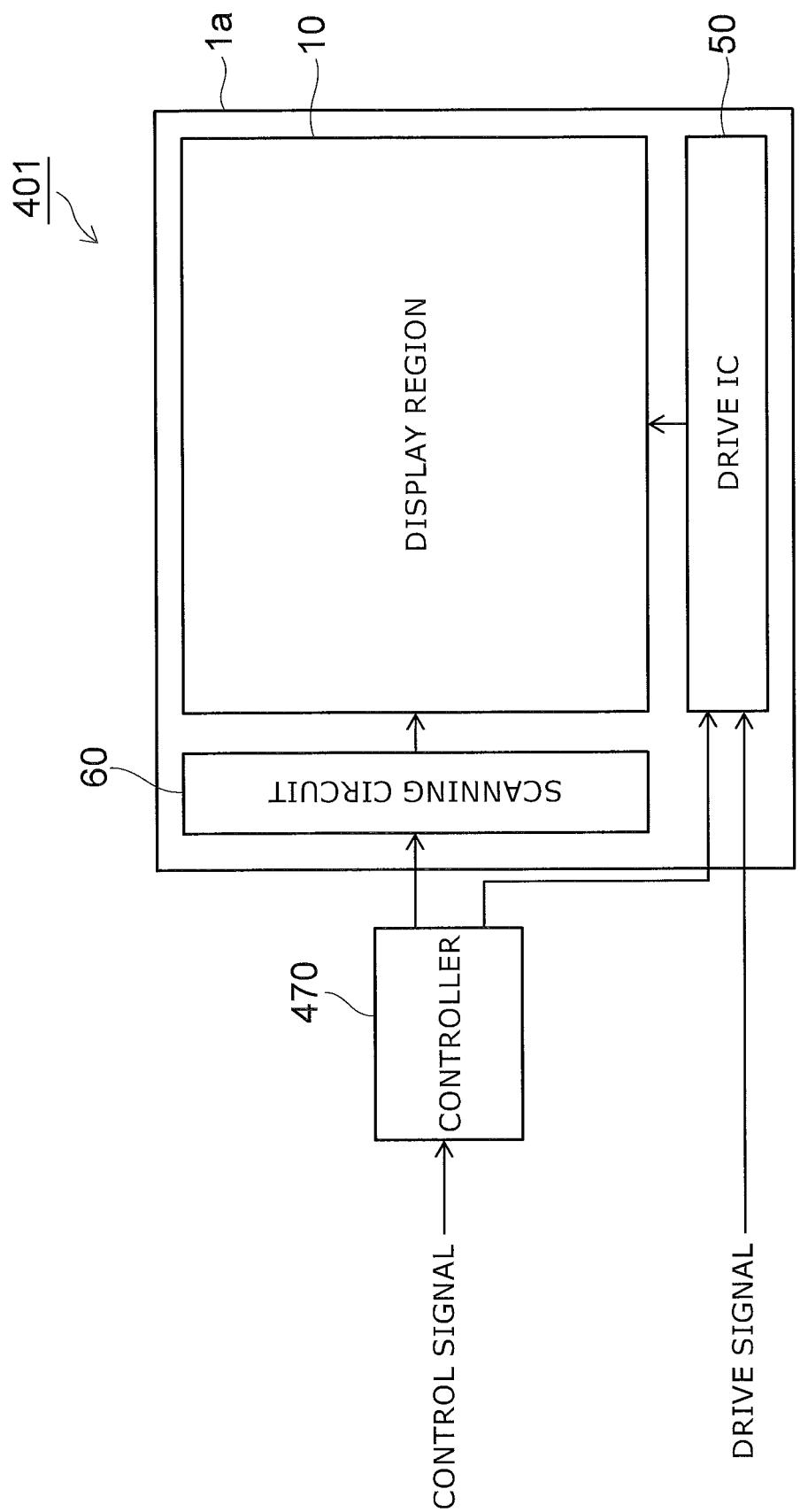
FIG. 8 is a block diagram illustrating the image display device according to a second embodiment.

FIG. 8 is a block diagram illustrating the image display device according to the embodiment.

FIG. 8 shows the major portions of the configuration of a computer display.

As shown in FIG. 8, the image display device 401 includes an image display module 1a. The image display module 1a includes the display region 10 and the drive IC 50 similar to those of the other embodiment described above. The image display module 1a further includes a scanning circuit 60. The scanning circuit 60 and the drive IC 50 set the drive sequence of the subpixels.

The image display device 401 further includes a controller 470. A control signal that is generated by separating by using not-illustrated interface circuitry is input to the controller 470; and the controller 470 controls the driving and the drive sequence of the subpixels in the drive IC 50 and the scanning circuit.

Modification

Figure 9:
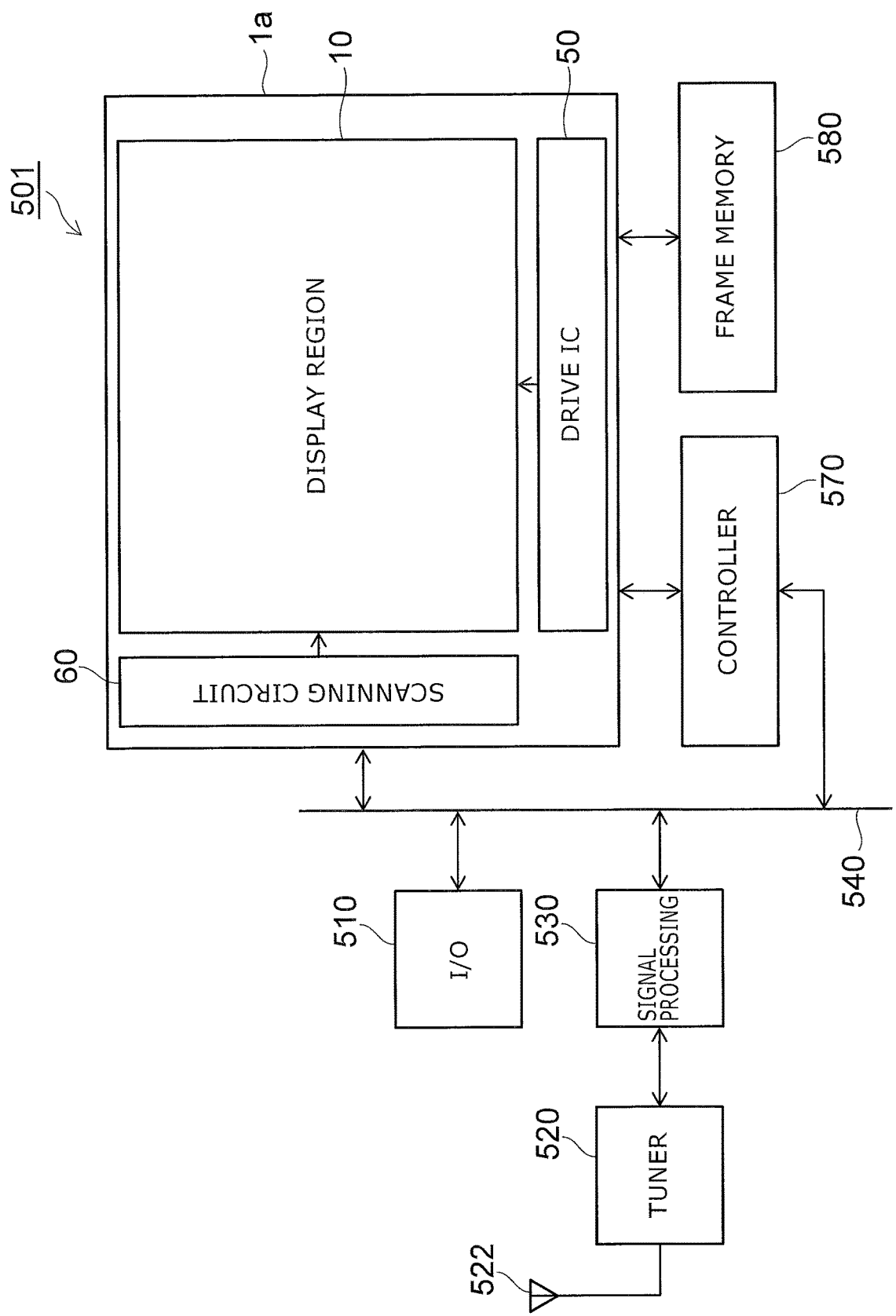
FIG. 9 is a block diagram illustrating an image display device of a modification of the second embodiment.

FIG. 9 is a block diagram illustrating an image display device of a modification of the second embodiment.

FIG. 9 shows the configuration of a high-definition thin television.

As shown in FIG. 9, the image display device 501 includes the image display module 1a. The image display device 501 includes a controller 570 and frame memory 580. Based on a control signal supplied by a bus 540, the controller 570 controls the drive sequence of the subpixels of the display region 10. The frame memory 580 stores one frame of display data and is used for smooth processing such as video image reproduction, etc.

The image display device 501 includes an I/O circuit 510. The I/O circuit 510 provides interface circuitry and the like for connecting to external terminals, devices, etc. The I/O circuit 510 includes, for example, an audio interface, a USB interface connecting to an external hard disk device, etc.

The image display device 501 includes a tuner 520 and a signal processing circuit 530. An antenna 522 is connected to the tuner 520; and the necessary signal is generated by separating from the radio wave received by the antenna 522. The signal processing circuit 530 includes a DSP (Digital Signal Processor), a CPU (Central Processing Unit), etc.; and the signal that is generated by separating by the tuner 520 is generated by separating into image data, audio data, etc., by the signal processing circuit 530.

Other image display devices can be made by using the tuner 520 and the signal processing circuit 530 as a high frequency communication module for the transmission and reception of a mobile telephone, WiFi, a GPS receiver, etc. For example, the image display device that includes an image display module having the appropriate screen size and resolution can be used as a personal digital assistant such as a smartphone, a car navigation system, etc.

According to the embodiments described above, an image display device and a method for manufacturing the image display device can be realized in which the manufacturing yield is increased by remedying a portion of the pixels including a defective light-emitting element and by omitting an inspection process for the light-emitting elements as single bodies.

What is claimed is:

1. An image display device, comprising:
a plurality of pixels each of which includes a plurality of subpixels, the plurality of subpixels comprising:
a first subpixel comprising:
a first light-emitting element configured to emit isochromatic light; and
a first wavelength conversion layer provided over the first light-emitting element to emit red light; and
a second subpixel comprising:
a second light-emitting element configured to emit the isochromatic light; and
a second wavelength conversion layer provided over the second light-emitting element to emit green light;
the plurality of pixels comprising at least one pixel comprising:
a defective subpixel;
the first subpixel; and
the second subpixel; and
a drive circuit configured to drive the plurality of subpixels based on data of an image signal such that the plurality of pixels reproduces the data of the image signal, the drive circuit including position data designating positions of the defective subpixel, the first subpixel, and the second subpixel, the drive circuit being configured to drive the first subpixel and the second subpixel based on the position data and data of red and green luminances.

2. The image display device according to claim 1, wherein the defective subpixel has a luminance lower than a prescribed luminance.

3. The image display device according to claim 1, wherein the defective subpixel has a luminance higher than a prescribed luminance.

4. The image display device according to claim 3, wherein the defective subpixel includes a layer that is opaque.

5. The image display device according to claim 1, wherein the first subpixel and the second subpixel are configured to emit blue light.

6. The image display device according to claim 1, wherein the first light-emitting element and the second light-emitting element include inorganic semiconductor light-emitting elements.

7. A method for manufacturing an image display device which includes a plurality of pixels including a plurality of subpixels, the method comprising:
a defective subpixel detection process comprising:
preparing the plurality of subpixels which include a plurality of light-emitting elements to emit light, respectively;
turning on the plurality of light-emitting elements;
acquiring image data of the plurality of light-emitting elements which have been turned on;
acquiring position data of positions of defective light-emitting elements and other light-emitting elements among the plurality of light-emitting elements; and
storing the position data; and
a wavelength conversion layer formation process comprising:
providing, based on the position data, a first wavelength conversion layer over one of the plurality of light-emitting elements to emit red light; and
providing, based on the position data, a second wavelength conversion layer over another of the plurality of light-emitting elements to emit green light.

8. The method according to claim 7, wherein at least one of the defective light-emitting elements has a luminance lower than a prescribed luminance.

9. The method according to claim 7, wherein at least one of the defective light-emitting elements has a luminance higher than a prescribed luminance.

10. The method according to claim 9, wherein the wavelength conversion layer formation process includes forming an opaque layer over the at least one of the defective light-emitting elements.

11. The method according to claim 7, wherein the plurality of light-emitting elements emits blue light.

12. The method according to claim 7, wherein the plurality of light-emitting elements is inorganic semiconductor light-emitting elements.

13. An image display device, comprising:
a plurality of pixels each of which includes a plurality of subpixels, the plurality of subpixels comprising:
a first light-emitting element configured to emit isochromatic light;

a first wavelength conversion layer provided over the first light-emitting element to emit red light;
a second light-emitting element configured to emit the isochromatic light;
a second wavelength conversion layer provided over the second light-emitting element to emit green light;
a third light-emitting element configured to emit the isochromatic light; and
a third wavelength conversion layer provided over the third light-emitting element to emit blue light;
the plurality of pixels comprising at least one pixel comprising:
a defective subpixel;
one subpixel including the first wavelength conversion layer; and
another subpixel including the second wavelength conversion layer; and
a drive circuit configured to drive the plurality of subpixels based on data of an image signal such that the plurality of pixels reproduces the data of the image signal, the drive circuit including position data designating positions of the defective subpixel, the one subpixel, and the another subpixel, the drive circuit being configured to drive the one subpixel and the another subpixel based on the position data and data of red and green luminances.

14. The image display device according to claim 13, wherein the defective subpixel has a luminance lower than a prescribed luminance.

15. The image display device according to claim 13, wherein the defective subpixel has a luminance higher than a prescribed luminance.

16. The image display device according to claim 15, wherein the defective subpixel includes a layer which is opaque.

17. The image display device according to claim 13, wherein the plurality of subpixels is light-emitting elements configured to emit ultraviolet light.

18. The image display device according to claim 13, wherein the plurality of subpixels is inorganic semiconductor light-emitting elements.

* * * * *